(12) United States Patent
Kontic

(10) Patent No.: US 6,645,782 B1
(45) Date of Patent: Nov. 11, 2003

(54) QUALITATIVE METHOD FOR TROUBLESHOOTING A DIELECTRIC TOOL

(75) Inventor: Andreja Kontic, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 39 days.

(21) Appl. No.: 10/134,084

(22) Filed: Apr. 25, 2002

(51) Int. Cl.⁷ ................................................ H01L 21/66
(52) U.S. Cl. .......................................... 438/16; 438/906
(58) Field of Search .............................. 438/7, 16, 690, 438/692, 906, FOR 142, FOR 141

(56) References Cited

U.S. PATENT DOCUMENTS

| | | | |
|---|---|---|---|
| 5,640,238 A | * | 6/1997 | Nakano et al. .......... 356/237.3 |
| 5,711,848 A | * | 1/1998 | Iturralde ...................... 438/14 |
| 5,909,276 A | * | 6/1999 | Kinney et al. ........... 356/237.2 |
| 5,940,300 A | * | 8/1999 | Ozaki ......................... 700/121 |
| 5,975,098 A | * | 11/1999 | Yoshitani et al. ........... 134/148 |
| 6,276,997 B1 | * | 8/2001 | Li ................................. 451/41 |
| 6,424,881 B1 | * | 7/2002 | Steffan et al. .............. 700/121 |
| 2002/0163637 A1 | * | 11/2002 | Rossman et al. ......... 356/237.4 |

FOREIGN PATENT DOCUMENTS

JP 10163284 A * 6/1998 ........... H01L/21/66

* cited by examiner

Primary Examiner—George Fourson
Assistant Examiner—Suk-San Foong
(74) Attorney, Agent, or Firm—Farjami & Farjami LLP

(57) ABSTRACT

According to one embodiment of the present invention, a method for determining the location of contaminants on a semiconductor wafer comprises obtaining a first particle count of the wafer, scrubbing the wafer, obtaining a second particle count of the wafer after scrubbing the wafer, and determining the location of the particles based on the first and second particle counts. According to another embodiment of the present invention, a method for determining the source of particle contaminants in a semiconductor processing tool comprises the steps of obtaining a first particle count of a wafer with at least one film deposited thereon, scrubbing the wafer, obtaining a second particle count of the wafer after scrubbing the wafer, and localizing areas of the processing tool where the particle contamination originates from.

18 Claims, 2 Drawing Sheets

QUALITATIVE METHOD FOR TROUBLESHOOTING A DIELECTRIC TOOL

BACKGROUND OF THE INVENTION

1. Field of the Invention

The invention relates to semiconductor processing, and more particularly to methods of determining particle contamination in semiconductor processing tools.

2. Description of the Related Art

The manufacturing of semiconductor devices requires high levels of cleanliness during the numerous manufacturing processes. For example, the surface of semiconductor wafers must be thoroughly cleaned of particle contaminants prior to processing. Further, films, such as dielectric films or metal films deposited on the semiconductor wafer, must also be thoroughly cleaned of particle contaminants. If not removed, contaminants on wafers and films may affect device performance characteristics and cause device failures to occur at faster rates than expected otherwise. Therefore, many of the processing steps are conducted in "clean rooms" to reduce possible particle contamination.

Nevertheless, semiconductor devices can become contaminated, and rendered defective, by contaminants during the various process steps. For example, during the various processing steps, contaminants can be introduced from the numerous processing tools because of incomplete cleansing of reagents from the tools.

Conventionally, determining the source of particle contamination in semiconductor processing tools involves primarily detective work. One must systematically look throughout the tools for the most probable source of the particle contamination source(s) until the source is identified. For example, once it is determined that particle contamination is a problem in a processing tool, the tool must be taken off-line until the contamination source can be identified and cleaned. Thus, the presence of particle contaminants in semiconductor processing tools can lead to time consuming searches for the source of the contamination.

Reducing particle contamination from semiconductor processing tools quickly is therefore of high importance. Tool downtime can be very costly as semiconductor processing is slowed or halted while the contamination source is located and cleaned. Further, accurately determining the source and eliminating the particle contamination is vital for producing high-quality semiconductor devices. Therefore, quickly and accurately determining the source of particle contamination in a semiconductor processing tool and returning the tool to service is of great importance.

A need exists, therefore, for a method to quickly diagnose whether contaminant particles are located in a film (dielectric or metal) deposited on a wafer, or rather on the surface of the film. This information allows one to quickly localize and determine specific areas of the semiconductor processing tool that may be the source of the particle contamination.

SUMMARY OF THE INVENTION

The present invention provides a method for qualitatively determining the location of contaminant particles on a semiconductor wafer with a film deposited thereon, and to localize areas of the processing tool as likely sources of the contamination.

According to one embodiment of the present invention, a method for determining the location of contaminants on a semiconductor wafer comprises obtaining a first particle count of the wafer, scrubbing the wafer, obtaining a second particle count of the wafer after scrubbing the wafer, and determining the location of the particles based on the first and second particle counts.

The method may further comprise removing only the particles on the surface of the wafer with a scrub. The scrub may be a non-contact brushless scrub, such as a D-sonic water scrubbing tool. The wafer further comprises a dielectric film or a metal film deposited thereon. The scrub removes only those particles on the surface of the film, and leaves behind those particles within or below the film. One can determine qualitatively that the particles are within a film formed thereon if the second particle count is substantially the same as the first particle count, and determine that the particles are on the surface of the wafer if the second particle count is less than the first particle count.

According to another embodiment of the present invention, a method for determining the source of particle contaminants in a semiconductor processing tool comprises the steps of obtaining a first particle count of a wafer with at least one film deposited thereon, scrubbing the wafer, obtaining a second particle count of the wafer after scrubbing the wafer, and localizing areas of the processing tool where the particle contamination originates from.

The method may further comprise comparing the first particle count with the second particle count, examining the film deposition portion of the processing tool if the first particle count and second particle count are substantially the same, and examining the portion of the processing tool that prepares the wafer for exit after the deposition if the first particle count is substantially less than the first particle count.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

In accordance with the principles of the present invention, a qualitative method to determine if contaminant particles are located on a surface of a semiconductor wafer, or if the particles are located within a film deposited on the semiconductor wafer. Determining where the particles are located allows a user to localize the source of the particles within the processing tool. A particle count is taken before and after scrubbing the wafer to determine the location of the contaminant particles. If the second particle count is less than the first particle count, particles were located on the surface of the film, and if the first and second particle counts are approximately equal, particles are located primarily within the film. The location of the particles allows one to localize the source of the contamination within specific areas of the processing tool. For example, one can quickly determine that the source of the particles is within the parts of the tool involved with the deposition of a dielectric layer, or rather those parts involved in the transferring of the wafer after the deposition. Quickly localizing the source of the particle contamination in the processing tool reduces the downtime of the processing tool necessary to find and clean the contamination source.

Figure 1:
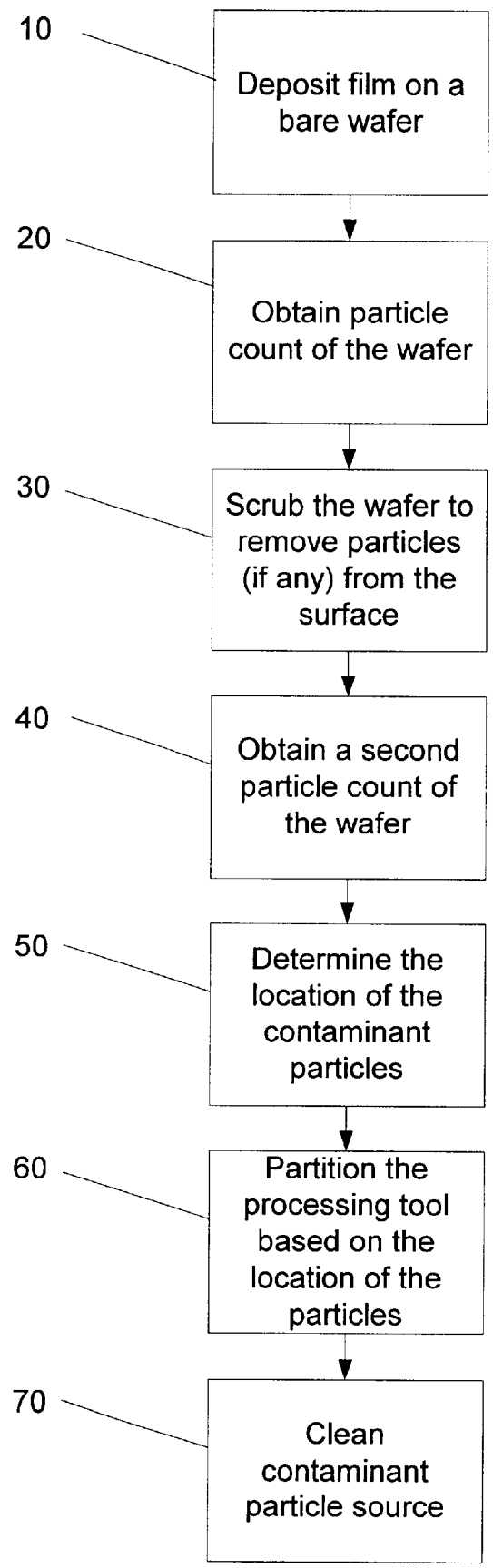
FIG. 1 is a block diagram of a method for determining the source of particle contamination according to one embodiment of the present invention.

FIG. 1 is a block diagram of a method for determining the source of particle contamination according to one embodiment of the present invention. Once it is determined that there is a contamination problem in a processing tool the method of the present invention can be used to quickly localize the probable source within the tool.

First, a dielectric film is deposited on a bare test wafer in block 10. For example, an 850 Å unpatterned film of TEOS can be deposited on the surface of the bare test wafer by a Novellus Concept 1 tool. The wafer is then used as a test wafer to quickly determine the location of the particles. This embodiment is described with a dielectric film, but of course, other films such as a metal or conductive film, may similarly be used in accordance with the present invention.

A first particle count is then obtained from the wafer and the dielectric film as indicated in block 20. The particle count in block 20 will be a count of all contaminant particles, whether within the dielectric film, or on the surface of the dielectric film. The particle count can be performed, for example, by scanning the wafer with an Inspex 8530 particle detection machine manufactured by Inspex, Inc., a KLA/Tencor SP1 particle detection machine manufactured by KLA/Tencor, Inc., or other similar machine that detects wafer particles.

The wafer is then cleaned or scrubbed in block 30. The wafer is cleaned in a manner to effectively remove contaminant particles from the surface of the dielectric film. The scrub, however, does not remove contaminant particles located within or below the film. For example, the wafer can be scrubbed with a D-Sonic ultrapure deionized water scrub, such as the DNS 80A scrubber tool manufactured by DaiNippon Screen Manufacturing, Co. The D-Sonic ultrapure deionized water scrub is a non-contact scrub, i.e., the scrub itself does not actually touch the wafer or dielectric film surface with brushes. Because the D-Sonic scrub does not touch the surface, the scrub effectively removes only those particles on the surface of the film and not those located within the film. Of course, other suitable scrubs, including scrubs with brushes that contact the wafer, may be used in accordance with the present invention.

A second particle count is then taken of the wafer with the dielectric layer after the scrub in block 40. The second particle count will determine the number of particles within or below the film because the scrub has removed any particles from the surface. Comparing the first particle count with the second particle count in block 50, qualitatively indicates where the particles are located. For example, if the first and second particle counts are approximately equal, the particles are located within or below the dielectric film. Conversely, if the second particle count is less than the first particle count, the particles were located on the outer surface of the dielectric film. Essentially, if particles are located on the surface of the film, the scrub removes them resulting in a lower second particle count.

Particles can also be located both within and on the surface of the film. In this case the second particle count will be lower than the first particle count, but remain at an unacceptably high level of particles. The method would, however, still provide the user with valuable information, namely that contaminant particles are located both within and on the surface of the film.

Based on the location of the contaminant particles from block 50, in block 60 one can then determine whether the contaminant particles were deposited during the dielectric film deposition process or after the film was deposited. This allows the user to partition the processing tool into areas that contribute to the deposition process and those that prepare the wafer for exit after the deposition process. The ability to partition the processing tool and localize the contamination source allows the user to quickly find and clean the contaminant source, resulting in reduced tool downtime.

For example, if the present invention were used to find a contamination source in the Novellus Concept 1 tool, determining that the particles are located on the surface of the film would limit the source of contamination to two of the six deposition stations (along with a cooling station and a loadlock). Thus, a large portion of the deposition chamber is eliminated as a possible contamination source, and valuable time in locating and cleaning the contamination source is saved.

Once the source has been localized, that area of the processing tool is examined in block 70 to determine the exact source of the particles. With a reduced area of the processing tool to search, the particle source can be found quickly and cleaned. In this manner tool downtime is greatly reduced when particle contamination is detected.

FIGS. 2A, 2B, 3A, and 3B illustrate various example of how the method operates according to an embodiment of the present invention.

Figure 2A:
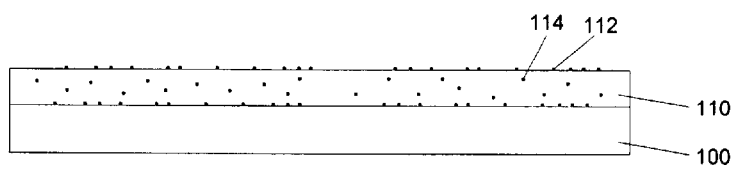
FIG. 2A is a cross-sectional view of a wafer with contaminant particles located both in a film deposited on the wafer and on the surface of the film.
Figure 2B:
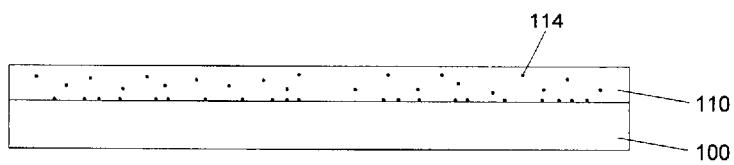
FIG. 2B is a cross-sectional view of a wafer with contaminant particles after being scrubbed.

FIG. 2A is a cross-sectional view of a wafer 100 with contaminant particles 112 and 114 located both within and on the surface of film 110 deposited on the wafer 100. A first particle count is taken of the wafer 100 in FIG. 2A. The particle count will include all particles 112 and 114 located in and on film 110. At this point, the user is unaware of the actual location of the particles 112 and 114. After the first particle count is taken, wafer 100 is scrubbed to remove any particles 112 possibly located on the surface of film 110. FIG. 2B is a cross-sectional view of wafer 100 with contaminant particles 114 located within the film 110 after being scrubbed. As can be seen, the scrub has removed particles 112 located on the surface of film 110, but left particles 114 within film 110 (compare with FIG. 2A). A second particle count is then taken of wafer 100. The second particle count will include only particles 114 that are located within film 110. In this example particles 112 and 114 were located both on the surface of film 110 and within film 110. Therefore, the second particle count is less than the first particle count indicating that there were particles 112 on the surface of film 110. Further, the second particle count would still be unacceptable high indicating that there are particles also within film 110. The user would therefore be aware that at least two particle sources exist—one in the deposition process areas, and one in the transfer areas of the tool.

Figure 3A:
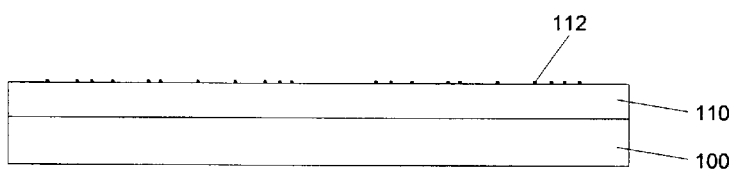
FIG. 3A is a cross-sectional view of a wafer with contaminant particles located only on the surface of a film deposited on the wafer.
Figure 3B:
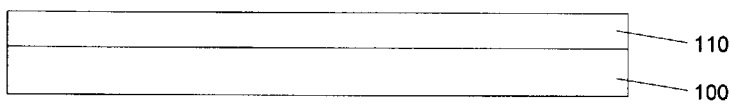
FIG. 3B is a cross-sectional view of a wafer after being scrubbed.

FIG. 3A is a cross-sectional view of a wafer 100 with contaminant particles 112 located only on the surface of a film 110 deposited on the wafer 100. A first particle count is taken of wafer 100 and includes all particles 112 located on the surface of film 110 and any located within film 110. At this point, the user is unaware of the actual location of the particles 112. FIG. 3B is a cross-sectional view of a wafer 100 after being scrubbed. A second particle count is then taken of wafer 100 to determine the location of particles 112. In this instance all particles 112 were located on the surface of film 110 and were removed by the scrub. The second particle count is therefore less than the first particle count and in this case at an acceptable level for contaminant particles. This indicates that the contamination is not occurring in the deposition process and localizes specific areas of the processing tool that could be the possible contaminant source. The user would therefore only have to examine and clean localized areas of the processing tool, for example, those involved in transferring the wafer after the deposition process.

Of course, other variations of the locations of the particles are possible, such as the particles being located only within film 110. It is also possible for wafer 100 to include multiple films 110 deposited thereon, such that the method is used to determine which film the contamination is occurring in and consequently which part of the processing tool is the source.

The above detailed descriptions are provided to illustrate specific embodiments of the present invention and are not intended to be limiting. Numerous modifications and variations within the scope of the present invention are possible. The present invention is defined by the appended claims.

I claim:

1. A method for determining the location of particles on a semiconductor wafer comprising the steps of:
   obtaining a first particle count of the wafer;
   scrubbing the wafer;
   obtaining a second particle count of the wafer after scrubbing the wafer; and
   determining the location of the particles based on the first and second particle counts.

2. The method of claim 1, wherein the wafer comprises a film deposited thereon.

3. The method of claim 2, wherein the wafer comprises a dielectric film deposited thereon.

4. The method of claim 2, wherein the wafer comprises a metal film deposited thereon.

5. The method of claim 1, wherein the wafer comprises a plurality of films deposited thereon.

6. The method of claim 2, wherein the scrubbing step removes only those particles on the exposed surface of the wafer.

7. The method of claim 1, wherein the scrubbing step comprises scrubbing the wafer with a non-contact scrub.

8. The method of claim 7, wherein the non-contact scrub is a D-sonic ultrapure water scrubbing tool.

9. The method of claim 1, wherein the step of determining the location of the particles further comprises comparing the first particle count with the second particle count, and if the second particle count is lower than the first particle count determining that the particles are located on the surface of the wafer or a film formed on the wafer.

10. The method of claim 1, wherein the step of determining the location of the particles further comprises comparing the first particle count with the second particle count, and if the second particle count is substantially the same as the first particle count determining that the particles are not located on the surface of the wafer or a film formed on the wafer.

11. A method for determining the source of contamination particles in a semiconductor processing tool comprising the steps of:
    obtaining a first particle count of a wafer with at least one film deposited thereon;
    scrubbing the wafer;
    obtaining a second particle count of the wafer after scrubbing the wafer; and
    localizing areas of the processing tool where the particle contamination originates from.

12. The method of claim 11, wherein the at least one film is either a dielectric or conductive film.

13. The method of claim 11, wherein the scrubbing step removes particles from the surface of the at least one film.

14. The method of claim 11, wherein the scrubbing step comprises scrubbing the wafer with a non-contact scrub.

15. The method of claim 14, wherein the non-contact scrub is a D-sonic water scrubbing tool.

16. The method of claim 11, wherein the step of localizing areas of the processing tool further comprises comparing the first particle count with the second particle count.

17. The method of claim 16, further comprising examining a film deposition portion of the processing tool if the first particle count and second particle count are substantially the same.

18. The method of claim 16, further comprising examining a portion of the processing tool that prepares the wafer for exit after the deposition if the first particle count is substantially less than the first particle count.

* * * * *